United States Patent
Kudo

[19]
[11] Patent Number: 6,127,095
[45] Date of Patent: Oct. 3, 2000

[54] ILLUMINATING OPTICAL DEVICE AND SEMICONDUCTOR DEVICE MANUFACTURING METHOD

[75] Inventor: Yuji Kudo, Tokyo, Japan

[73] Assignee: Nikon Corporation, Tokyo, Japan

[21] Appl. No.: 09/017,762

[22] Filed: Feb. 3, 1998

[30] Foreign Application Priority Data

Feb. 3, 1997 [JP] Japan ................................. 9-034378
Dec. 25, 1997 [JP] Japan ................................. 9-367138

[51] Int. Cl.$^7$ ................................................ H01L 21/027
[52] U.S. Cl. ........................... 430/311; 430/396; 355/67; 355/77
[58] Field of Search .......................... 430/311, 30, 396; 355/67, 53, 77; 359/209, 210

[56] References Cited

U.S. PATENT DOCUMENTS

| | | | |
|---|---|---|---|
| 4,947,030 | 8/1990 | Takahashi | 250/201.1 |
| 5,581,075 | 12/1996 | Naraki et al. | 250/205 |
| 5,739,899 | 4/1998 | Nishi et al. | 355/53 |
| 5,798,824 | 8/1998 | Kudo | 355/67 |
| 5,867,319 | 2/1999 | Sugiyama et al. | 359/618 |

FOREIGN PATENT DOCUMENTS

| | | |
|---|---|---|
| 0 486 316 | 5/1992 | European Pat. Off. |
| 8-179237 | 7/1996 | Japan |

*Primary Examiner*—John McPherson
*Attorney, Agent, or Firm*—Chapman & Cutler

[57] ABSTRACT

An illuminating optical device comprises a light source for supplying light, and a condenser lens system for collecting the light from the light source and guiding the light onto an object to be illuminated. The condenser lens system has an optical element that has a refractive power, and that can be tilted or decentered with respect to the optical axis of the condenser lens system. By tilting or decentering the optical element, sloped illuminance distributions can be deliberately produced, which can cancel out uneven illuminance distributions having opposite slopes which originally exist in the system. Consequently, satisfactory uniform as well as desired specific non-uniform illuminance distributions can be achieved.

20 Claims, 6 Drawing Sheets

| SURFACE SERIAL NO. | RADIUS OF CURVATURE mm | SPACE BETWEEN TWO ADJACENT SURFACES mm | INDEX OF REFRACTION |
|---|---|---|---|
| S1 | 5.0 | 12.0 | 1.50000 |
| S2 | -4.0 | 1.6 | 1.00000 |
| S3 | INF. | 100.0 | 1.00000 |
| S4 | -1000.0 | 10.3 | 1.50000 |
| S5 | -100.0 | 1.0 | 1.00000 |
| S6 | 100.0 | 10.0 | 1.50000 |
| S7 | -1000.0 | 103.4 | 1.00000 |
| S8 | INF. | 0 | 1.00000 |

ILLUMINATING OPTICAL DEVICE AND SEMICONDUCTOR DEVICE MANUFACTURING METHOD

This application is a continuation-in-part (CIP) of prior application No. 08/576,667, filed Dec. 21, 1995, and issued Aug. 25, 1998 as U.S. Pat. No. 5,798,824.

BACKGROUND OF THE INVENTION

1. Field of Invention

This invention relates to an illuminating optical device for uniformly illuminating an object, which is suitably used in exposure apparatuses for manufacturing highly integrated semiconductor circuits.

2. Description of Related Art

Figure 5:
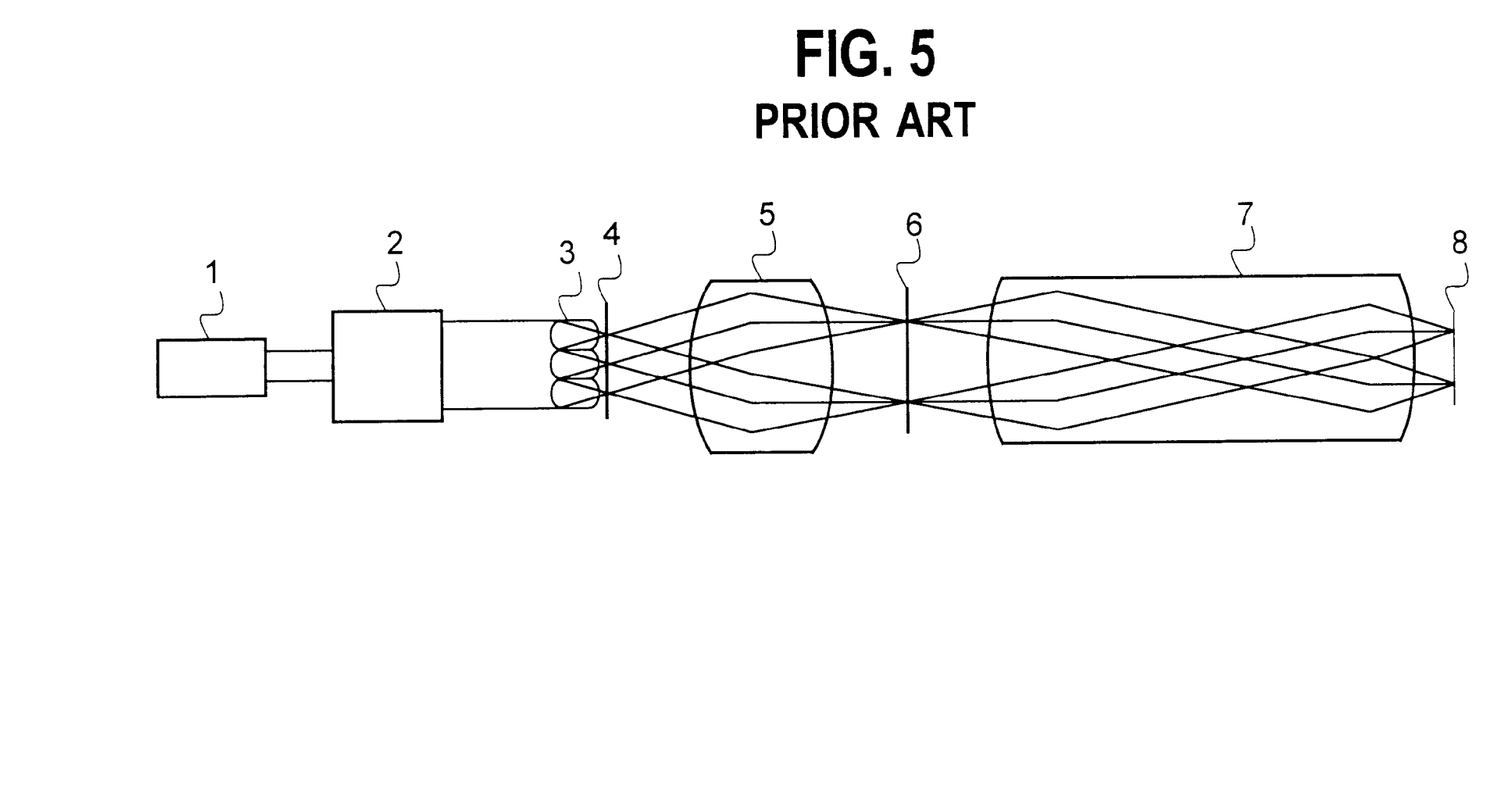
FIG. 5 illustrates a conventional illuminating optical device.

One example of conventional illuminating optical devices is shown in FIG. 5, which is designed to uniformly illuminate objects. The light flux emitted from the light source 1 is shaped by the light shaping optical system so as to fit the fly-eye lens 3. The shaped light flux is divided into a plurality of light components by the fly-eye lens 3, and a plurality of secondary light-source images are formed in the vicinity of the exit plane of the fly-eye lens 3. An aperture stop 4 is positioned on or near the secondary light-source image plane in order to limit the light flux from the plurality of secondary light-source images. The light flux is collected by the condenser lens 5, and guided onto the mask 6 in such a manner that the fluxes from the multiple secondary light-source images overlap, thereby uniformly illuminating the pattern on the mask 6. The pattern image is projected onto the wafer surface 8 by the projection lens system 7.

Because the light flux is divided into multiple components by the fly-eye lens 3, and because the condenser lens 5 guides these light components onto the mask 6 so that they overlap each other when they illuminate the pattern, the light intensity becomes satisfactorily uniform on the wafer 8 even if the intensity distribution of the original light flux from the light source 1 is not perfectly uniform.

Recently, a technique for varying the aperture pattern of the aperture stop 4 in accordance with the mask pattern to be projected onto the wafer 8 has drawn a great deal of attention because this technique can further improve the resolution and the focal depth. This technique is called variable illumination. Some examples of aperture patterns of an aperture stop are illustrated in FIG. 4.

Figure 6:
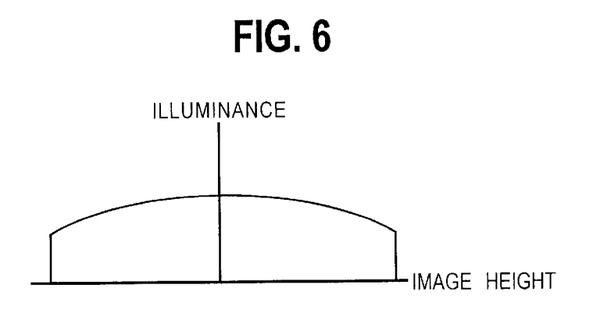
FIG. 6 illustrates the convex component of an uneven illuminance distribution.
Figure 7:
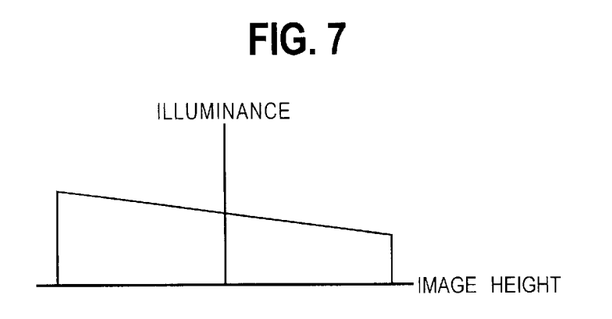
FIG. 7 illustrates the sloped component of uneven illuminance distribution.

However, it was found through various analyses and experiments that if the aperture pattern of the aperture stop 4 is changed during the illumination of an optical system, the illuminance becomes uneven on the wafer 8. This unevenness of illuminance causes the thickness of the circuit pattern image projected onto the wafer 8 to vary depending on the position on the wafer 8, which variance adversely affects the performance of the resultant semiconductor circuit. FIGS. 6 and 7 illustrate typical types of unevenness in illuminance. The illuminance distribution having uneven on wafer includes convex component as shown FIG. 6 (or concave component) and sloped component as shown FIG. 7. In FIG. 6, the illuminance distribution is convex, while, in FIG. 7, the illuminance distribution is sloped. There are many factors, which may combine with each other, which cause the uneven illuminance, for example, manufacturing error in the optical system, decentering of the aperture stop, non-uniform distribution of transmissivity of the optical system (due to the characteristic of the AR coat or dust), etc.

SUMMARY OF THE INVENTION

Therefore, it is an object of the invention to provide an illuminating optical device which can achieve satisfactorily uniform illuminance, or a desired illumination intensity distribution, by eliminating the sloped portion, the convex portion or the concave portion of the illuminance distribution.

In order to achieve the object, in one aspect of the invention, an illuminating optical device that comprises a light source for supplying light and a condenser optical system for collecting the light supplied from the light source and guiding the light onto an object to be illuminated is provided. The condenser optical system includes an optical member that has a refractive power, and that can be decentered from the optical axis of the condenser optical system. In this context the term "decenter" implies both tilting the optical member with respect to the optical axis and shifting the optical member horizontally and/or vertically within a plane perpendicular to the optical axis.

Because the condenser optical system includes an optical member that has a refractive power and can be decentered from the optical axis, the sloped component comprising the unevenness of the illuminance distribution can be canceled out by deliberately producing an opposite sloped component that compensates for the original sloped component of the illuminance.

In the second aspect of the invention, an illuminating optical device, which comprises an optical integrator that forms a plurality of light sources and a condenser optical system for collecting the light from each of the light sources and guiding the light onto an object to be illuminated, is provided. The condenser optical system includes an optical member that has a refractive power, and can be decentered from the optical axis of the condenser optical system so as to adjust the illuminance distribution on the object being illuminated.

The combination of the optical integrator and the condenser optical system that includes an optical member which has a refractive power and can be decentered can achieve illumination with a highly uniform illuminance by eliminating the uneven sloped component of the illuminance distribution.

This illuminating optical device may further comprise a changing unit for varying the shape or the size of the plurality of light sources. In this case, the optical member is decentered from the optical axis of the condenser optical system in response to the change of the shape or the size of the plurality of light sources.

The changing unit has a plurality of aperture stops, each having an aperture whose shape or size differs from the others, and one of the aperture stops is selected and positioned on or near a position where the plurality of light sources is formed by the optical integrator.

This arrangement allows so-called variable illumination, in which the shape and the size of the light sources are adjusted according to the pattern on the mask. Consequently, the resolution and the focal depth can be improved. In addition, the optical member having a refractive power is decentered from the optical axis of the condenser optical system, in response to the change of the shape or the size of the light sources, so as to compensate for the sloped component of the uneven illuminance distribution caused by the variable illumination.

The illuminating optical devices provided in the first and second aspects of the invention may further comprise an illuminance sensor for detecting the illuminance distribution on the object being illuminated. In this case, the optical member is decentered from the optical axis of the condenser optical system according to the illuminance distribution detected by the illuminance sensor.

The decentering amount required for the optical member can be based on the measured illuminance distribution.

The illuminating optical device of the second aspect of the invention may further comprise both an illuminance sensor for detecting the illuminance distribution on the object being illuminated, and a driving unit for decentering the optical member according to the illuminance distribution detected by the illuminance sensor. In this case, the illuminance distribution varies in response to the change of the shape or the size of the plurality of light sources.

This illuminating optical device further comprises a decentering amount calculation unit for calculating the necessary amount of decentering of the optical member based on the detection result of the illuminance sensor. In this case, the driving unit is driven based on the calculated decentering amount.

Because the illuminance distribution is detected every time the changing unit is activated, and because the driving unit can decenter the optical member according to the currently measured illuminance distribution, the unevenness of the illuminance due to the change of the shape or the size of the light sources can be appropriately compensated for.

The condenser optical system may have a second optical member which is movable along the optical axis of the condenser optical system.

By moving the second optical member along the optical axis of the condenser optical system, the uneven convex component of an illumination distribution can be canceled out by deliberately producing a concave component to compensate for the convex component. Thus, the movement of the second optical member along the optical axis of the condenser optical system is effective for correction of the convex component of an uneven convex illumination distribution, while decentering of the first optical member is effective for correction of the sloped component of an uneven sloped illumination distribution.

The illuminating optical device further comprises a second driving unit for moving the second optical member along the optical axis of the condenser optical system according to the illuminance distribution detected by the illuminance sensor. In this case, the illuminating optical device has a decentering amount calculation unit that calculates the necessary amount of decentering of the optical member and the necessary amount of displacement of the second optical member along the optical axis based on the detection result of the illuminance sensor. Based on these calculation results, the optical member and the second optical member are appropriately driven.

The second optical member is appropriately moved along the optical axis of the condenser optical system based on the calculated displacement amount, thereby effectively compensating for the convex component of an uneven illumination distribution.

Preferably, the optical member has at least one refracting surface that has an refractive power of $\emptyset$ (mm$^{-1}$) which lies within the range $0.001 < |\emptyset| < 0.1$.

This arrangement allows the distortion of the light flux which strikes the object being illuminated to be greatly reduced, while producing a compensatory sloped component of illuminance distribution sufficient to cancel out the unevenness of the illuminance.

In still another aspect of the invention, a semiconductor device manufacturing method is provided. In this method, the illuminating optical device described above is used. Then, a mask, on which a predetermined pattern is formed, is prepared. Also, a photosensitive substrate is prepared. Then, the mask is illuminated using the illuminating optical device to form the pattern on the photosensitive substrate.

Since the photosensitive substrate is exposed to uniform illumination light, and any uneven components of an uneven illumination distribution have been compensated for, high-quality semiconductor circuits can be manufactured, while the yield is increased.

BRIEF DESCRIPTION OF THE DRAWINGS

The above and other objects, features, and advantages of the invention will be apparent from the detailed description which follows by way of exemplary embodiments of the invention with reference to the attached drawings, which are here described.

DETAILED DESCRIPTION OF THE PREFERRED EMBODIMENTS

The preferred embodiments of the invention will now be described in detail with reference to the attached drawings. The same numerical symbols indicate the same elements throughout the drawings.

Figure 1:
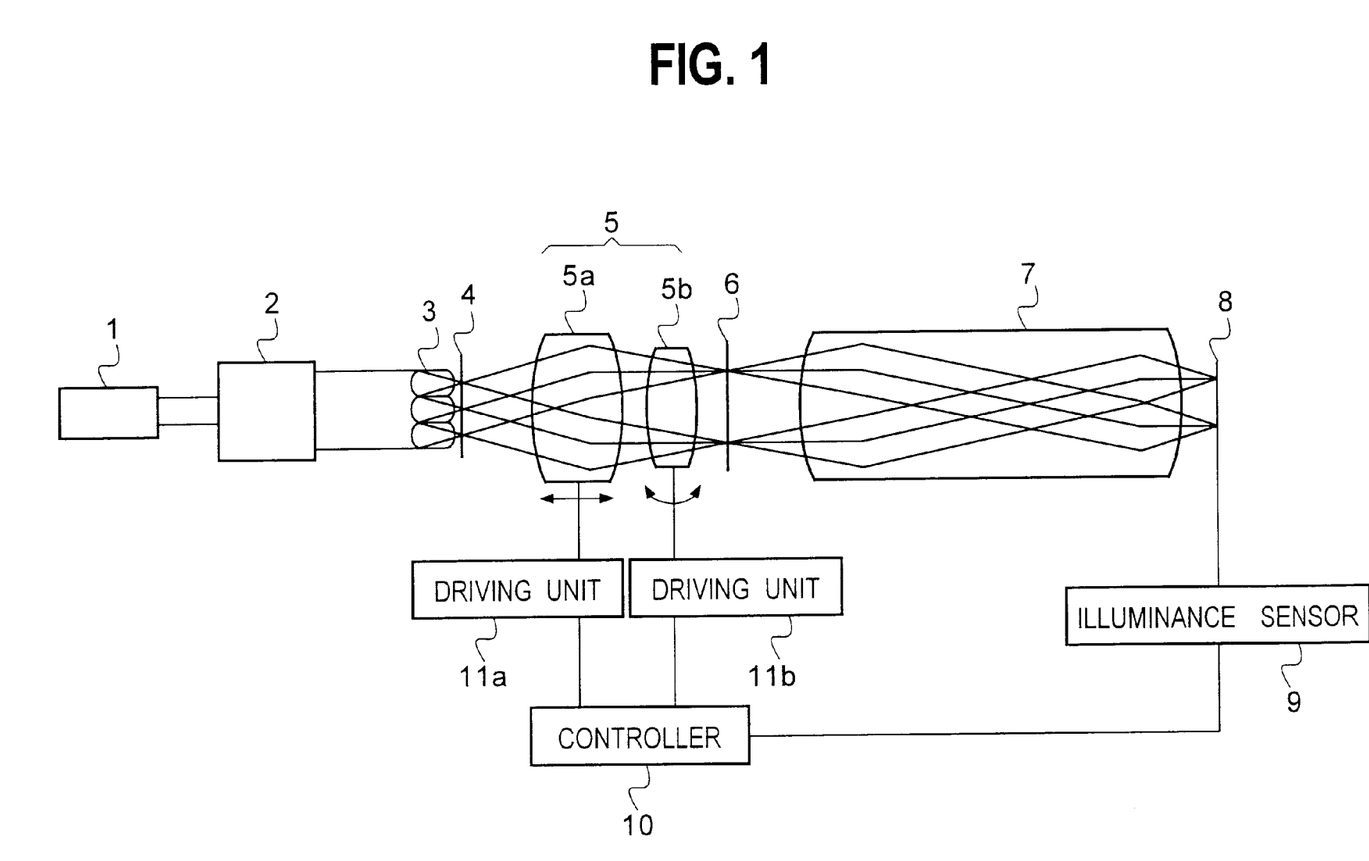
FIG. 1 illustrates the illuminating optical device according to an embodiment of the invention.

FIG. 1 illustrates the illuminating optical system according to the first embodiment of the invention. The light source 1 is, for example, an excimer laser. The light flux emitted from the light source 1 is shaped by a light shaping optical system 2 which includes a cylindrical lens. The shaped light flux strikes a fly-eye lens 3, which functions as an optical integrator and forms a plurality of secondary light sources.

A condenser optical system 5 is positioned behind the fly-eye lens 3 in order to guide the light flux onto a mask (i.e., a reticle) 6. The light that has passed through the mask 6 enters the projection lens system 7 which projects the pattern formed on the mask 6 onto a substrate 8 that is positioned on a plane conjugate with the mask 6.

An aperture stop 4 is positioned on or near the secondary light source plane defined by the fly-eye lens 3.

The condenser optical system 5 includes a front lens group 5a and a rear lens group 5b, both of which are optical members having refractive powers. The front lens group 5a is connected to a front group driving unit 11a, while the rear lens group 5b is connected to a rear group driving unit 11b. The driving unit 11a and 11b are connected to a controller 10.

An illuminance sensor 9 is positioned on the image plane of the projection lens system 7, which is aligned with the top surface of the substrate 8, in order to measure the illuminance on that plane. The illuminance sensor is also connected to the controller 10, and the measured illuminance values are input to the controller 10.

The light flux emitted from the light source 1 is shaped by the light shaping optical system 2 so as to be suitable in size for the fly-eye lens 3. The fly-eye lens 3 divides the shaped light flux into a plurality of components to form a plurality of secondary light sources in the vicinity of its exit plane. In other words the fly-eye lens as the optical integrator forms a plurality of light sources.

The light fluxes from the secondary light-source images are limited by the aperture stop 4, collected by the condenser lens system 5, and guided onto the mask 6 in such a manner that the fluxes from the multiple secondary light-source images overlap. As a result, the pattern on the mask is illuminated uniformly by the overlapping light fluxes. This pattern image of mask 6 is projected onto the surface of the substrate (i.e., wafer) 8 by the projection lens system 7.

Even if the intensity distribution of the light flux emitted from the light source 1 is not satisfactorily uniform, the light intensity finally becomes substantially uniform on the wafer 8 by operation of the fly-eye lens 3 and the condenser optical system 5. In addition, the resolution and the focal depth of the system are improved by the variable illumination technique of changing the aperture pattern of the aperture stop 4 according to the pattern which is to be projected onto the wafer 8.

Figure 2:
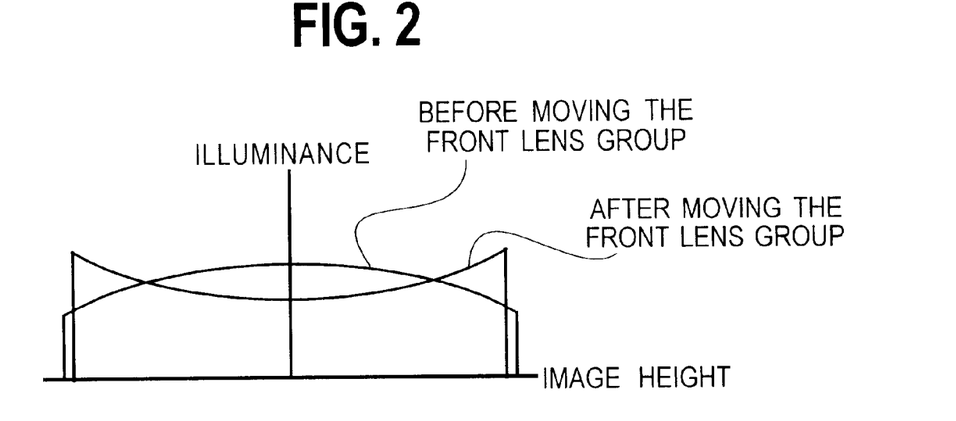
FIG. 2 illustrates how the illuminance distribution is compensated for by moving the front group 5a of the condenser optical system along the optical axis of the condenser optical system shown in FIG. 1.

As has been indicated above, the condenser optical system 5 includes the front lens group 5a and the rear lens group 5b. The front lens group 5a is moved along the optical axis of the condenser optical system 5 by the driving unit 11a. If the front lens group 5a is moved, a concave or convex illuminance distribution can be produced deliberately depending on the direction in which the front lens group 5a is moved. FIG. 2 shows an example, in which the convex component of the illuminance distribution which is caused by changing the aperture pattern is compensated for by producing a concave component by moving the front lens group 5a.

Figure 3:
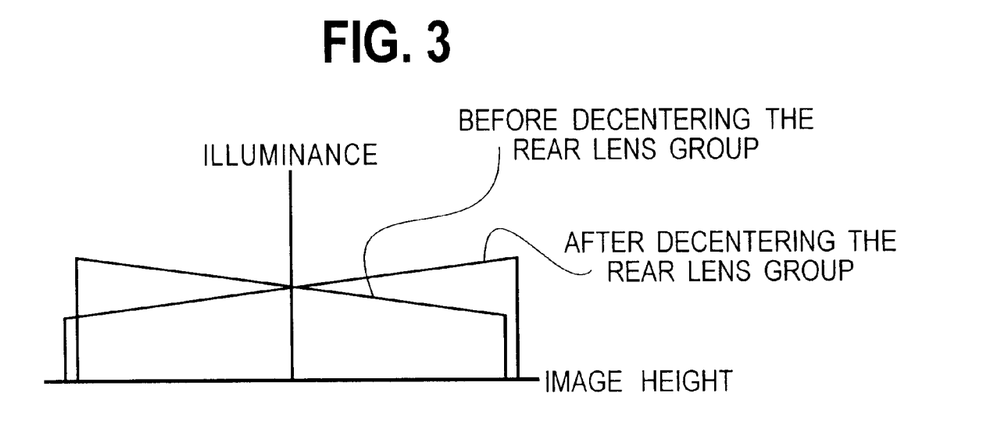
FIG. 3 illustrates how the illuminance distribution is compensated for by tilting the rear group 5b of the condenser optical system shown in FIG. 1.

On the other hand, the rear lens group 5b is tilted by the driving unit 11b. If the rear lens group 5b is tilted, a sloped illuminance distribution can be produced as shown in FIG. 3. In this tilting mechanism, there are two pivoting axes so that the rear lens group 5b can be tilted in either direction with respect to the optical axis of the condenser optical system 5. Alternatively, the rear lens group 5b may be designed so as to be shifted in horizontally and/or vertically within a given plane perpendicular to the optical axis, instead of being tilted. Thus can be achieved the same effect as with tilting.

The refractive power arrangement of the condenser optical system 5 and the position of the pivoting axes are selected so that the change of the telecentricity of the wafer surface caused by the movements of the front and rear lens groups 5a and 5b does not significantly affect the system.

Because, in this embodiment, unevenness of the illuminance distribution is corrected by adjusting the positions of the front lens group 5a and/or the rear lens group 5b, both of which are optical elements having refractive powers, there is no light-quantity loss, unlike the case in which the unevenness is corrected for by adjusting the transmissivity of the lens using, for example, a filter.

The fly-eye lens 5 may be replaced with, for example, an optical rod which also functions as an optical integrator. In addition, although only one optical integrator is used in this embodiment, two optical integrators may be used to further improve the uniformity of the illuminance.

FIG. 4 shows examples of aperture patterns used in the technique of variable illumination. FIG. 4(a) shows a round aperture having a relatively large diameter, FIG. 4(b) shows an annular (or zonal) aperture, FIG. 4(c) shows a round aperture having a relatively small diameter and FIG. 4(d) shows four small round apertures each positioned the same distance from the center of the aperture stop. Among these patterns, a suitable one is selected according to the pattern to be printed on the wafer.

Figure 4A:
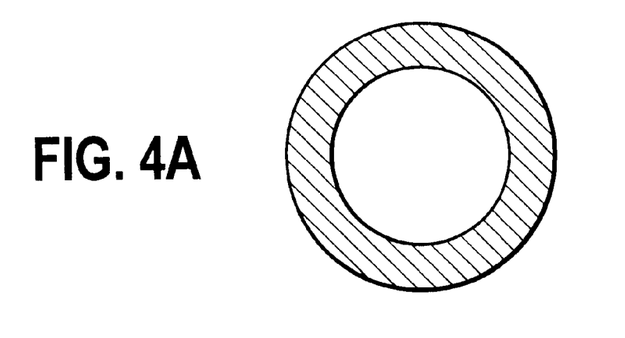
FIG. 4 illustrates examples of aperture patterns of the aperture stop 4.
Figure 4B:
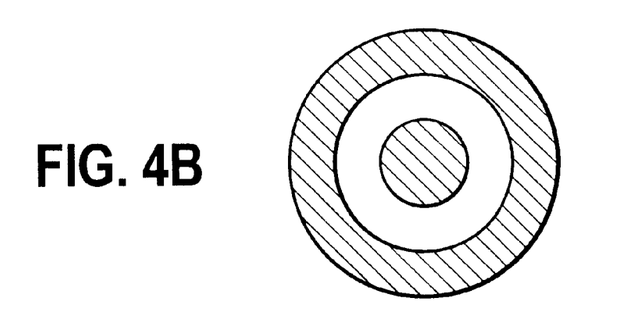
Figure 4C:
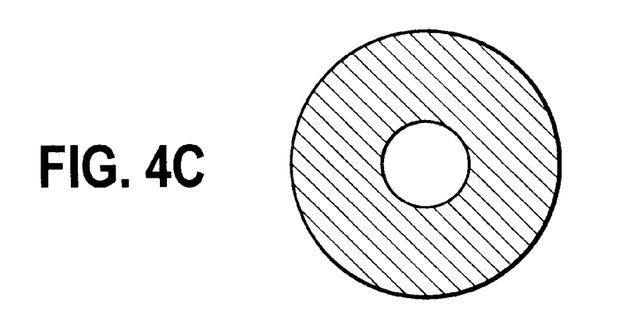
Figure 4D:
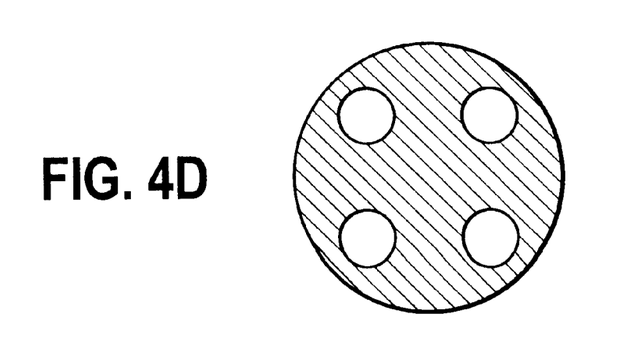

If the aperture pattern shown in FIG. 4(a) was selected first with a uniform illuminance distribution, and if this aperture pattern was changed to that shown in FIG. 4(b), then a slope component and a curved component of unevenness arise in the illuminance distribution. This can be caused by many factors, such as manufacturing errors in the optical systems, decentering of the aperture stop, a fluctuation in the transmissivity of the optical system due to the nature of the AR coat or dust. In general, if the aperture pattern of the aperture stop changes, the illuminance distribution inevitably becomes uneven.

In order to correct for the uneven components of the illuminance, the front lens group 5a and the rear lens group 5b of the condenser optical system 5 are adjusted in this embodiment. In particular, the front lens group 5a is moved along the optical axis of the condenser optical system 5 to compensate for any uneven curved component of an illuminance distribution, while the rear lens group 5b is tilted with respect to the optical axis to compensate for any uneven sloped component of an illuminance distribution, in order to keep the illuminance distribution substantially uniform.

The degree of unevenness of the illuminance distribution is measured by the illuminance sensor 9. Based on the result of this measurement, the controller 10 calculates the appropriate amounts of displacement and tilt, respectively, of the front lens group 5a and the rear lens group 5b. The driving units 11a and 11b drive the front lens group 5a and the rear lens group 5b, respectively, to compensate for the uneven illuminance distribution.

The measurement, calculation and driving are repeated until the uniformity of the illuminance distribution becomes satisfactory. In other words, these operations are repeated until the unevenness is reduced to within a predetermined acceptable range.

Alternatively, optimum positions of the front lens group 5a and the rear lens group 5b may be decided and stored in advance in association with the corresponding aperture patterns. In this case, the front and rear lens groups 5a and 5b are moved directly to the optimum positions stored in the controller 10 in response to a change of the aperture pattern of the aperture stop 4. This can achieve quick adjustment as compared with the previous example (in which positioning of the lens groups 5a and 5b is repeated based on the measurement results of the illuminance sensor). However, if the unevenness pattern of the illuminance distribution has suddenly changed due to some previously unaccounted factors, the optimum positions must be set and stored again (i.e., the optimum positions must be stored in the controller 10 again).

Figure 9:
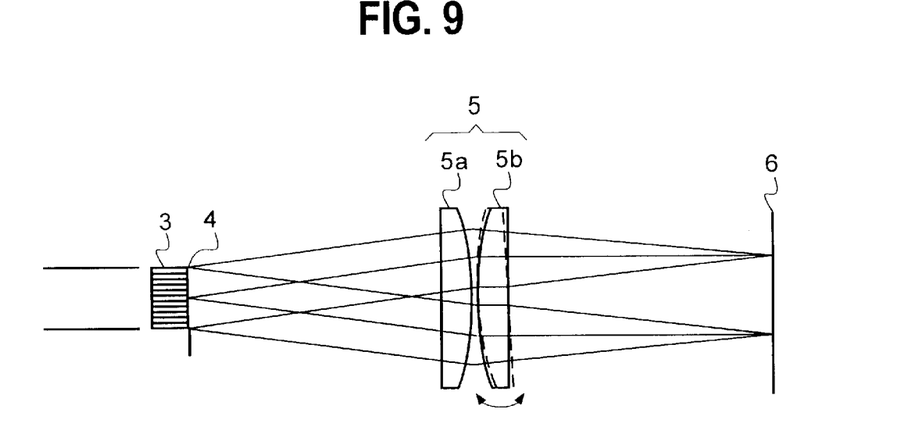
FIG. 9 illustrates a part of the illuminating optical device according to the second embodiment of the invention.

FIG. 9 illustrates the illuminating optical device according to the second embodiment of the invention. In this figure, the portion of the configuration from the fly-eye lens 3 (which functions as an optical integrator) to the mask 6 being illuminated is shown. The condenser optical system 5 includes a front lens 5a, which is positioned closer to the fly-eye lens 3, and a rear lens 5b, which is positioned closer to the mask 6. The rear lens 5b has a refractive power, and is tilted with respect to the optical axis of the condenser optical system 5. The rear lens 5b is connected to a driving unit 11b (not shown in FIG. 9) as in the first embodiment shown in FIG. 1.

Suppose that the radius of curvature of one lens surface, the lens surface in the lens 5b, is r (mm), and that the incident refractive index and the exit refractive index in the lens surface in the lens 5b are n1 and n2, respectively, Then the refractive power $\emptyset$ (mm$^{-1}$) of this lens surface is expressed as $$\emptyset = (n2-n1)/r \quad (1)$$

If the lens 5b has at least one refractive surface having a refractive power $\emptyset$ that lies within the range $0.001 < |\emptyset| < 0.1$, then a sufficient amount of sloped component whose slope is opposite in sign to the sloped component of the uneven illuminance distribution that was caused by changing the aperture pattern, can be produced by simply tilting the lens 5b. Consequently, distortion of the conical light flux that should converge on a certain point of the mask surface 6 is reduced to a minimum. This type of distortion is generally caused as a side effect of changing the aperture pattern.

FIG. 9 illustrates the condenser lens system 5 of this embodiment. Although the lens 5a is a single lens whose surface has a refractive power $\emptyset$, the lens 5b may be designed as a lens group consisting of two or more lenses. In this case, any one of the lenses comprising the rear lens group 5b should have a refractive surface whose refractive power lies within the range $0.001 < |\emptyset| < 0.1$.

Figure 8:
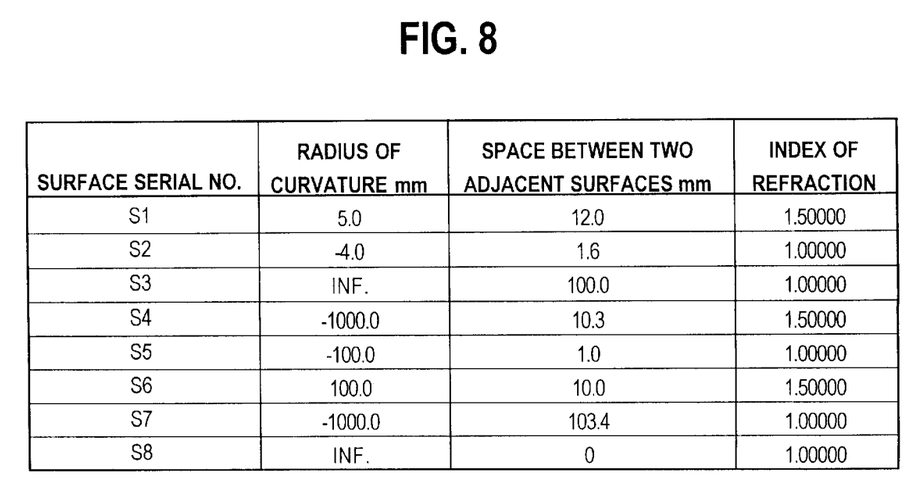
FIG. 8 is a table of the lens data used in the optical system according to the second embodiment of the invention.

FIG. 8 shows the actual parameter values of the illuminating optical device shown in FIG. 9. In this table, the radius of curvature and the distance between two adjacent lens surfaces are given in millimeters (mm). The abbreviation "inf" denotes infinity. S1 denotes the incident surface of the fly-eye lens 3, and S2 denotes the exit surface of the fly-eye lens 3. The fly-eye lens 3 consists of a 10×10 lens matrix, each lens having dimensions of 2 mm×2 mm. S3 denotes the aperture stop whose effective diameter is 20 mm. S4 through S7 denote the lens surfaces of the lenses 5a and 5b of the condenser optical system 5. S8 is the mask surface (i.e., the illuminated surface) 6.

Each distance between two adjacent lens surfaces listed in this table is the length from the lens surface listed in the same row to the next lens surface. For example, the distance listed in the first row (for S1) indicates the length between S1 and S2. Each index of refraction corresponds to the distance listed in the same row, and indicates the index of refraction of the material that fills this distance. For example, the value "1.50000" cited in the first row denotes the index of refraction of the fly-eye lens 3 which is made of glass and has an on-axis distance of 12.0 mm between the incident surface S1 and the exit surface S2.

From this data, the refractive powers of the two surfaces S6 and S7 of the lens 5b can be calculated from equation (1):

$$\emptyset_{(S6)} = (1.5-1.0)/100 = 0.005$$

$$\emptyset_{(S7)} = (1.0-1.5)/(-1000) = 0.0005$$

Surface S6 satisfies the condition $0.001 < |\emptyset| < 0.1$, while S7 does not. Since at least one surface of the lens 5b satisfies this condition, the lens 5b can produce a sufficient compensatory uneven slope component of an illuminance distribution.

Figure 10:
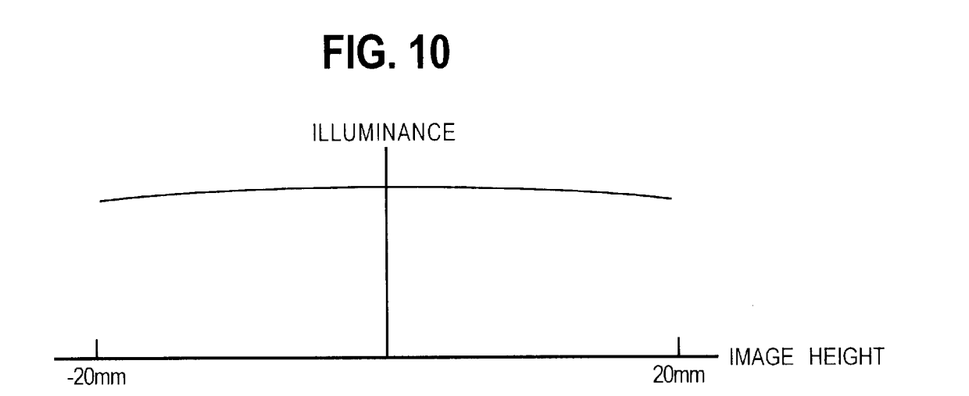
FIG. 10 illustrates a substantially uniform illuminance distribution when the aperture pattern has not been changed and when the rear lens group 5b of the condenser optical system has not been tilted.
Figure 11:
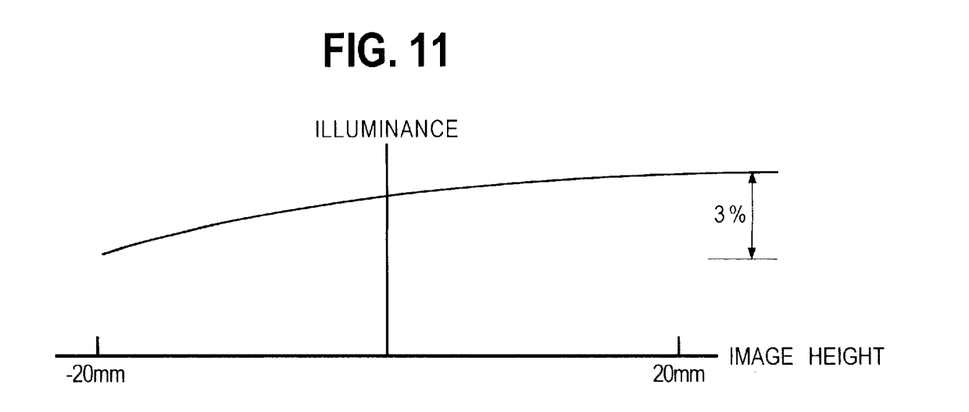
FIG. 11 illustrates an uneven illuminance distribution whose profile is deliberately sloped by tilting the rear lens group 5b of the condenser optical system.

If the lens 5b is in the right position, without being tilted, in the illuminating optical device of FIG. 9, the illuminance distribution is symmetric as shown in FIG. 10. Then, if the lens 5b is tilted by 3A without changing the aperture pattern, the illuminance distribution becomes asymmetric as shown in FIG. 11. The higher the image height, the greater the illuminance. The illuminance difference between the image heights of 20 mm and −20 mm is as much as 3%.

As has been explained, the lens (or the lens group) that is to be tilted must have at least one surface that has a certain degree of refractive power. If that surface has a large refractive power, a sufficient amount of compensatory unevenness can be produced with a small tilt. However, a large refractive power is likely to cause the conical light flux converging on the mask surface to deform as a side effect. Therefore, the preferred range of the refractive power is $0.001 < |\emptyset| < 0.1$.

In this embodiment, the lens 5b that has a surface whose refractive power satisfies the condition $0.001 < |\emptyset| < 0.1$ is tilted with respect to the optical axis in order to compensate for the sloped component of an uneven illuminance distribution. However, as an alternative, this lens 5b may be moved within a given plane perpendicular to the optical axis of the condenser optical system 5, instead of being tilted. This can achieve the same effect as tilting, and effectively correct for the sloped component of the unevenness.

After the illuminance distribution is corrected by the condenser optical system, the mask 6 is exposed to the illumination light in order to transfer the pattern onto the wafer. This process is called a photolithographing step. The mask 6 is positioned in the object plane of the projection lens system 7, while a wafer, that is, a photosensitive substrate 8 is positioned in the image plane of the projection lens system 7. The image of the mask pattern is transferred onto the photosensitive substrate (the wafer coated with photoresist) through the projection optical system 7. The exposed portion becomes soluble in an etchant.

After the photolithographing step, the wafer is developed, and the surface of the wafer is etched, while the portion that is still coated with a resist layer (i.e., that was not exposed to the illumination light) remains. After the etching step, the unnecessary resist layer is removed, whereby the wafer, on which a plurality of patterns are printed, is completed. In the next step (a dicing step) of the assembling process, the wafer is cut into chips so that each chip has a pattern. Then, each chip is provided with interconnections (in a bonding step), and packaged (in a packaging step), whereby a final semiconductor device, such as an LSI, is completed.

In this example, semiconductor devices are manufactured by the photolithographing step using a projection-exposure apparatus that includes the illuminating optical device of the present invention. However, many other semiconductor devices, such as liquid crystal devices, thin-film magnetic heads, and image-pickup devices (CCDs) can also be manufactured using the illuminating optical device of the present invention.

In the embodiment, the pattern of the aperture stop is changed in order to change the shape of the secondary light source in accordance with the pattern to be exposed. However, the invention is not limited to this example, but any methods that can change the shape of the secondary light source can be used. For example, the cross-sectional shape of the light flux striking the fly-eye lens 3 may be changed using a cone lens.

Further, a super-high-pressure mercury-vapor lamp may be used as the light source, in place of the excimer laser. In this case, the light is corrected by an elliptical mirror and guided to the optical integrator (i.e., the fly-eye lens).

As has been mentioned above, the rear lens 5b (or the rear lens 5b group if it includes multiple lenses) may be shifted within a plane perpendicular to the optical axis of the condenser optical system, instead of being tilted, depending on the structure of the entire optical system. This can achieve the same effect as tilting.

In the case of shifting the rear lens group within a given plane, in order to reduce the change of the telecentricity due to the lens shift, it is preferable to design the optical system so that two or more lenses can be shifted in different directions.

Although, in this embodiment, the illuminating optical device of the present invention is applied to projection-exposure apparatuses for projecting a pattern of a mask 6 onto a wafer 8, it is also applicable to contact-exposure apparatuses or proximity-exposure apparatuses.

With this illuminating optical device, various types of uneven illuminance distributions due to, for example, changes in transmissivity of the optical system which occurs as time passes, or changes of the light source, or maintenance operations, can be compensated for. No matter what the cause is, uneven illuminance distribution can be effectively corrected.

In this particular embodiment, the unevenness of the illuminance distribution on the wafer 8 is corrected in order to obtain uniform illuminance distribution. However, the present invention may also be applied to the case in which it is desired to make the illuminance higher or lower in the peripheral area of the wafer than in the central area depending on the mask pattern or other factors of the optical system. The illuminating optical device of the present invention can easily and precisely control the illuminance distribution, and produce a desired illuminance distribution simply by adjusting the front and rear lenses.

Instead of moving the front lens along the optical axis and tilting or decentering the rear lens, the illuminating optical device may be designed so that the front lens is tilted or decentered and the rear lens is moved along the optical axis.

In this way, according to the invention, very minute semiconductor-circuit patterns can be accurately transferred onto wafers by compensating for uneven components (such as sloped components or concave or convex components) of an illuminance distribution by tilting or decentering some or all of the lenses of the condenser optical system and by moving some or all of the lenses of the condenser optical system along the optical axis thereof.

Although the invention has been described by way of exemplary embodiments, it should be understood that many changes and substitutions may be made by those skilled in the art without departing from the spirit and the scope of the invention which is defined only by the appended claims.

What is claimed is:

1. An illuminating optical device comprising:
    a light source for supplying light;
    a condenser optical system for collecting the light supplied from the light source and guiding the light onto an object to be illuminated, the condenser optical system including at least two optical members with optical power; and
    a secondary light source system disposed between the light source and the condenser optical system so as to form a secondary light source and vary shape or size of the secondary light source;
    wherein the condenser optical system includes a decentering unit for decentering at least one optical member from an optical axis of the condenser optical system in accordance with a change of shape or size of the secondary light source.

2. The illuminating optical device according to claims 1, wherein the optical member has at least one refracting surface that has a refractive power of $\varnothing$ ($mm^{-1}$) which lies within the range $0.001 < |\varnothing| < 0.1$.

3. The illuminating optical device according to claim 1, wherein the secondary light source system comprises:
    an optical integrator disposed at a position to receive light supplied from the light source so as to form the secondary light source system; and
    a changing unit for varying shape or size of the secondary light source.

4. The illuminating optical device according to claim 3, further comprising an illuminance sensor for detecting the illuminance distribution on an object, and a driving unit for decentering the optical member from the optical axis of the condenser optical system according to the illuminance distribution detected by the illuminance sensor in order to adjust the illuminance distribution on the object.

5. The illuminating optical device according to claim 4, further comprising a calculation unit for calculating a necessary amount of decentering of the optical member based on the detection result of the illuminance sensor, and providing a calculated result to the driving unit.

6. The illuminating optical device according to claims 3, wherein the optical member has at least one refracting surface that has a refractive power of $\varnothing$ ($mm^{-1}$) which lies within the range $0.001 < |\varnothing| < 0.1$.

7. An exposure apparatus for exposing an image of a pattern formed on a mask onto a photosensitive substrate, comprising:
    an illumination optical system for illuminating the mask; and
    a projection system disposed between the mask and the photosensitive substrate;
    wherein the illumination optical system includes:
        a light source for supplying light;
        a condenser optical system for collecting the light from the light source and guiding the light onto the mask, the condenser optical system including at least two optical members with optical power; and
        a secondary light source system disposed between the light source and the condenser optical system so as to form a secondary light source, and
        wherein the condenser optical system includes a decentering unit for decentering at least one optical member from an optical axis of the condenser optical system in accordance with a change of shape or size of the secondary light source.

8. The exposure apparatus according to claim 7, wherein the secondary light source system comprises:
    an optical integrator disposed at a position to receive light supplied from the light source so as to form the secondary light source system; and
    a changing unit for varying shape or size of the secondary light source.

9. The exposure apparatus according to claim 8, wherein the changing unit has a plurality of aperture stops, each having an aperture whose shape or size differs from others, and at least one of the aperture stops is positioned on and near a position where the plurality of light sources is formed by the optical integrator.

10. The exposure apparatus according to claim 8, further comprising an illuminance sensor for detecting the illuminance distribution on the photosensitive substrate.

11. The exposure apparatus according to claim 10, further comprising a driving unit for decentering the optical member from the optical axis of the condenser optical system according to the illuminance distribution detected by the illuminance sensor.

12. The exposure apparatus according to claim 11, further comprising a calculation unit for calculating a necessary amount of decentering of the optical member based on the detection result of the illuminance sensor, and providing a calculated result to the driving unit.

13. The exposure apparatus according to claim 11, wherein the condenser optical system including an additional optical member which is movable along the optical axis of the condenser optical system.

14. The exposure apparatus according to claim 13, further comprising an additional driving unit for moving the additional optical member along the optical axis of the condenser optical system according to the illuminance distribution detected by the illuminance sensor.

15. The exposure apparatus according to claim 14, wherein the optical member and the additional optical member are driven by the driving unit and the additional driving unit based on provided calculation results from the calculation unit for a necessary amount of decentering for the optical member and a necessary amount of movement along the optical axis for the second optical member.

16. The exposure apparatus according to claim 8, wherein the optical member has at least one refracting surface that has a refractive power of $\varnothing$ ($mm^{-1}$) which lies within the range $0.001 < |\varnothing| < 0.1$.

17. The exposure apparatus according to claim 7, wherein the optical member has at least one refracting surface that has a refractive power of $\varnothing$ ($mm^{-1}$) which lies within the range, $0.001 < |\varnothing| < 0.1$.

18. A semiconductor device manufacturing method comprising the steps of:

providing an exposure apparatus comprising an illuminating optical system and a projection system, the illumination optical system having a secondary light source and an adjustable optical member with optical power;

changing shape or size of the secondary light source;

decentering the adjustable optical member with respect to an optical axis in accordance with a change of shape or size of the secondary light source;

illuminating a mask with a predetermined pattern by using the illumination optical system; and projecting an image of the predetermined pattern onto a photosensitive substrate by using the projection system.

19. A semiconductor device manufacturing method according to claim 18, further comprising the step of detecting an optical characteristic at an imaging plane of the projection system before the step of changing shape or size of the secondary light source.

20. A semiconductor device manufacturing method according to claim 19, wherein the optical characteristic includes an illuminance distribution on the photosensitive substrate to be formed through the projection system.

* * * * *